(12) United States Patent
Smeets et al.

(10) Patent No.: US 11,474,436 B2
(45) Date of Patent: Oct. 18, 2022

(54) TUNING PATTERNING APPARATUS BASED ON OPTICAL CHARACTERISTIC

(71) Applicant: ASML NETHERLANDS B.V., Veldhoven (NL)

(72) Inventors: Bart Smeets, Bilzen (BE); Anita Bouma, De Meern (NL); Johannes Jacobus Matheus Baselmans, Oirschot (NL); Birgitt Noelle Cornelia Liduine Hepp, Waalre (NL); Paulus Hubertus Petrus Koller, Roermond (NL); Carsten Andreas Köhler, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 16/973,732

(22) PCT Filed: Jun. 11, 2019

(86) PCT No.: PCT/EP2019/065107
§ 371 (c)(1),
(2) Date: Dec. 9, 2020

(87) PCT Pub. No.: WO2020/001965
PCT Pub. Date: Jan. 2, 2020

(65) Prior Publication Data
US 2021/0247698 A1    Aug. 12, 2021

(30) Foreign Application Priority Data
Jun. 29, 2018   (EP) .................................... 18180889

(51) Int. Cl.
*G03F 7/20* (2006.01)

(52) U.S. Cl.
CPC .......... *G03F 7/70525* (2013.01); *G03F 7/705* (2013.01)

(58) Field of Classification Search
CPC .................................................. G03F 7/70525
See application file for complete search history.

(56) References Cited

U.S. PATENT DOCUMENTS 7,488,933 B2   2/2009   Ye et al.
7,587,704 B2   9/2009   Ye et al.
(Continued)

FOREIGN PATENT DOCUMENTS

CN    102841510    12/2012
EP      2028546     2/2009
(Continued)

OTHER PUBLICATIONS

International Search Report and Written Opinion issued in corresponding PCT Patent Application No. PCT/EP2019/065107, dated Aug. 7, 2019.
(Continued)

*Primary Examiner* — Steven Whitesell Gordon
(74) *Attorney, Agent, or Firm* — Pillsbury Winthrop Shaw Pittman, LLP

(57) ABSTRACT

A method for tuning a target apparatus of a patterning process. The method includes obtaining a reference performance, and measurement data of a substrate subjected to the patterning process at the target apparatus, the measurement data indicative of a performance of the target apparatus; determining a cause of a performance mismatch based on a difference between the reference performance and the performance of the target apparatus, wherein the cause includes an optical characteristic; and responsive to the cause, adjust-
(Continued)

ing an optical parameter associated with an adjustable optical characteristic to reduce the performance mismatch in the optical characteristic.

20 Claims, 11 Drawing Sheets

(56) References Cited

U.S. PATENT DOCUMENTS

| | | |
|---|---|---|
| 8,200,468 B2 | 6/2012 | Ye et al. |
| 2007/0031745 A1 | 2/2007 | Ye et al. |
| 2007/0050749 A1 | 3/2007 | Ye et al. |
| 2008/0184192 A1 | 7/2008 | Zhang et al. |
| 2008/0301620 A1 | 12/2008 | Ye et al. |
| 2008/0309897 A1 | 12/2008 | Wong et al. |
| 2009/0300573 A1 | 12/2009 | Cao et al. |
| 2010/0146475 A1 | 6/2010 | Cao et al. |
| 2010/0162197 A1 | 6/2010 | Ye et al. |
| 2010/0180251 A1 | 7/2010 | Ye et al. |
| 2011/0099526 A1 | 4/2011 | Liu |
| 2012/0303151 A1 | 11/2012 | Ye et al. |
| 2012/0327383 A1 | 12/2012 | Cao et al. |

FOREIGN PATENT DOCUMENTS

| | | |
|---|---|---|
| TW | 201812443 | 4/2018 |
| WO | 2017063827 | 4/2017 |

OTHER PUBLICATIONS

European Search Report issued in corresponding European Patent Application No. 18180889, dated Nov. 29, 2019.

TUNING PATTERNING APPARATUS BASED ON OPTICAL CHARACTERISTIC

CROSS-REFERENCE TO RELATED APPLICATIONS

This application is the U.S. national phase entry of PCT Patent Application No. PCT/EP2019/065107, which was filed on Jun. 11, 2019, which claims the benefit of priority of European Patent Application No. 18180889.0, which was filed on Jun. 29, 2018, and which is incorporated herein in its entirety by reference.

FIELD

The description herein relates to patterning apparatuses and processes, and more particularly to a method or tool for tuning of an apparatus of a patterning process, such as optical parameters related to a lithographic apparatus.

BACKGROUND

A lithography apparatus is a machine that applies a desired pattern onto a target portion of a substrate. A lithography apparatus can be used, for example, in the manufacture of devices such as integrated circuits (ICs). In that circumstance, a patterning device (e.g., a mask or a reticle) may be used to generate a pattern corresponding to an individual layer of the device, and this pattern can be transferred onto a target portion (e.g. comprising part of, one or several dies) on a substrate (e.g. a silicon wafer) that has, e.g., a layer of radiation-sensitive material (resist), by methods such as irradiating the target portion via a pattern on the patterning device. In general, a single substrate will contain a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, a lithographic projection apparatus will have a demagnification factor M (generally >1), the speed F at which the substrate is moved will be a factor M times that at which the projection beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Optical systems can play a role in the performance of a patterning process. Accordingly, there is provided herein technique to enable patterning process design, modification, control, etc. based on a characteristic of an optical system of a patterning apparatus such as a scanner.

According to an embodiment, there is provided a method for tuning a target apparatus of a patterning process. The method includes obtaining (i) a reference performance, and (ii) measurement data of a substrate subjected to the patterning process at the target apparatus, the measurement data indicative of a performance of the target apparatus; determining, via a processor, a cause of a performance mismatch based on a difference between the reference performance and the performance of the target apparatus, where the cause includes an optical characteristic; and responsive to the cause, adjusting, via the processor, optical parameters associated with an adjustable optical characteristic to reduce the performance mismatch in the optical characteristic.

In an embodiment, the determining the cause includes obtaining a sensitivity model including the optical parameters associated with the adjustable optical characteristic; performing a sensitivity analysis based on the sensitivity model employing the reference performance and the measurement data; and identifying dominant optical parameters that cause the performance mismatch.

In an embodiment, the adjusting the optical parameters is an iterative process. An iteration includes determining values of the dominant optical parameters such that the performance mismatch is reduced; adjusting optical parameters of the target apparatus according to the determined values of the optical parameters; and determining whether the performance mismatch is reduced.

In an embodiment, the optical characteristic is a non-tunable characteristic represented by an apodization map, a phase map, a retardatiaon map, and/or a diattenuation map.

In an embodiment, the adjusting of the optical parameters include adjusting an illumination pupil of the target apparatus when the cause is lens apodization or lens diattenuation.

In an embodiment, the adjusting of the optical parameters include adjusting lens aberrations of the target apparatus when the cause is lens retardation.

In an embodiment, the performance mismatch is minimized.

In an embodiment, the method further includes printing a pattern on the substrate using the target apparatus tuned according to the values of the optical parameters; and obtaining measurement data of the printed pattern; and verifying the performance of the target apparatus against the reference performance based on the measurement data.

In an embodiment, the reference performance is a performance of a reference apparatus different from the target apparatus.

In an embodiment, the reference performance is a performance of the target apparatus determined at a particular time of the patterning process.

In an embodiment, the performance and the reference performance are related to a parameter of the patterning process including critical dimension and/or overlay.

Furthermore, there is provided a method for tuning a target apparatus of a patterning process. The method includes obtaining (i) a reference performance, (ii) measurement data of a substrate subjected to the patterning process at the target apparatus, the measurement data indicative of a performance of the target apparatus, and (iii) a sensitivity model configured to translate an optical characteristic to the performance of the patterning process; determining, via a processor, a performance mismatch based on difference between the reference performance and the measurement data; simulating, via the processor, the sensitivity model to determine a cause of the performance mismatch; and responsive to the cause, adjusting, via the processor, optical parameters corresponding to the optical characteristic of the target apparatus to reduce the performance mismatch.

In an embodiment, the optical characteristic is a non-tunable characteristic represented by an apodization map, a phase map, a retardatiaon map, and/or a diattenuation map.

In an embodiment, the adjusting of the optical parameters include adjusting an illumination pupil of the target apparatus when the cause is lens apodization or lens diattenuation.

In an embodiment, the adjusting of the optical parameters include adjusting lens aberrations of the target apparatus when the cause is lens retardation.

Furthermore, there is provided a computer program product comprising a non-transitory computer readable medium having instructions recorded thereon, the instructions when executed by a computer implementing steps of the method described above.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

Before describing embodiments in detail, it is instructive to present an example environment in which embodiments may be implemented.

Figure 1:
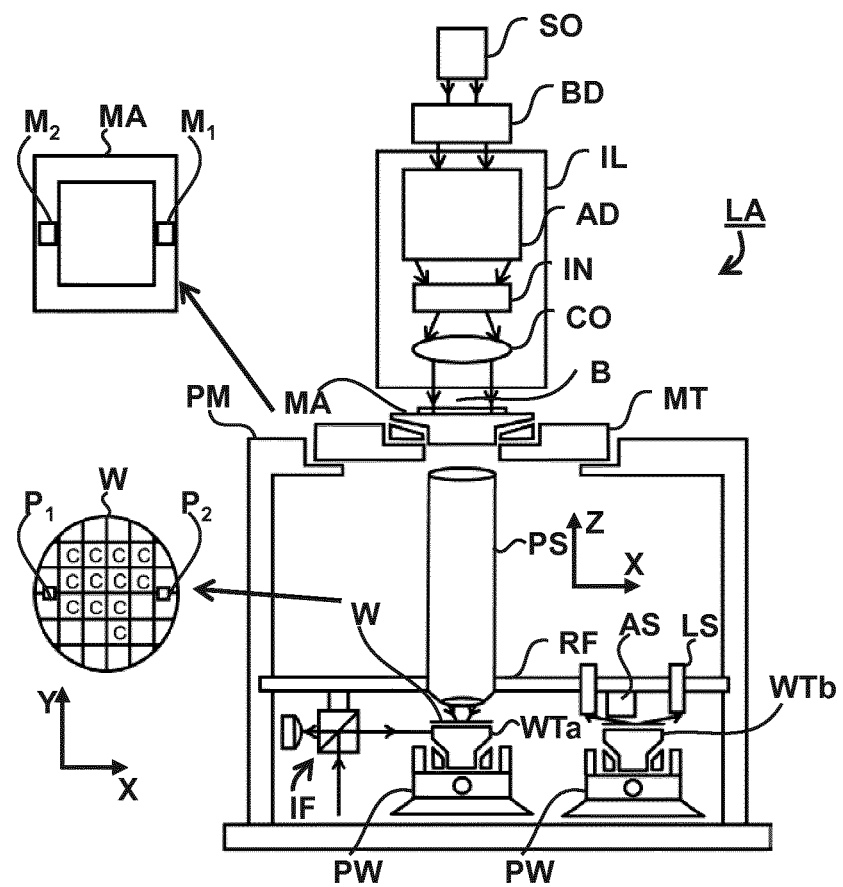
FIG. 1 schematically depicts a lithography apparatus, according to an embodiment.

FIG. 1 schematically depicts an embodiment of a lithographic apparatus LA. The apparatus comprises:

an illumination system (illuminator) IL configured to condition a radiation beam B (e.g. extreme ultra violet (EUV) radiation or electromagnetic radiation such as UV radiation or DUV);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT (e.g., WTa, WTb or both) constructed to hold a substrate (e.g. a resist-coated wafer) W and connected to a second positioner PW configured to accurately position the substrate in accordance with certain parameters; and a projection system (e.g. a refractive, catoptric or catadioptric projection system) PS configured to project a pattern imparted to the radiation beam B by patterning device MA onto a target portion C (e.g. comprising one or more dies and often referred to as fields) of the substrate W, the projection system supported on a reference frame (RF).

As here depicted, the apparatus is of a transmissive type (e.g. employing a transmissive mask). Alternatively, the apparatus may be of a reflective type (e.g. employing a programmable mirror array or LCD matrix, or employing a reflective mask).

The illuminator IL receives a beam of radiation from a radiation source SO (e.g., a mercury lamp or excimer laser). The radiation source and the lithographic apparatus may be separate entities, for example when the radiation source is an excimer laser. In such cases, the radiation source is not considered to form part of the lithographic apparatus and the radiation beam is passed from the radiation source SO to the illuminator IL with the aid of a beam delivery system BD comprising for example suitable directing mirrors and/or a beam expander. In other cases the radiation source may be an integral part of the apparatus, for example when the radiation source is a mercury lamp. The radiation source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

So, the illuminator IL may comprise adjuster AM configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable alter the polarization of the beam and may be operable to adjust the polarization using adjuster AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A particularly convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism AM configured to adjust one or more of the optical elements so as to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

So, in operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
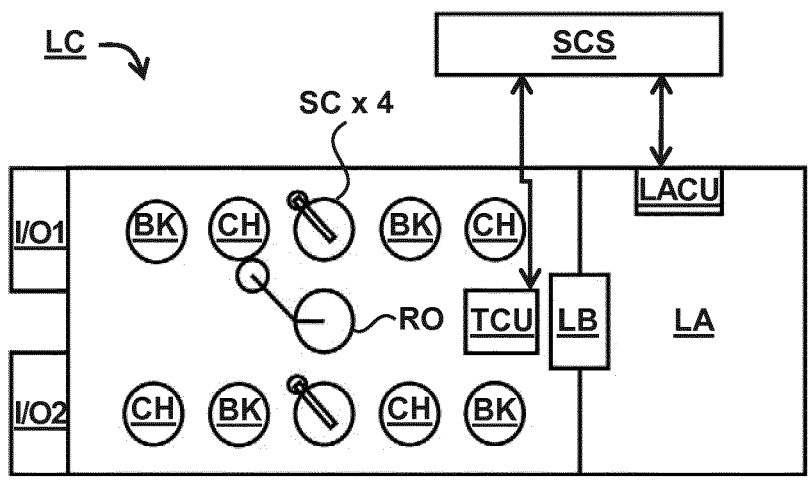
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

As device manufacturing processes used to manufacture devices such as ICs continue to advance, the dimensions of functional elements have continually been reduced while the amount of functional elements, such as transistors, per device has been steadily increasing over decades, following a trend commonly referred to as "Moore's law". To enable this, some processes aim to create patterns at or below the classical resolution limit.

The process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (e.g., 193 nm or about 13 nm, e.g., about 13.5 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a device designer in order to achieve particular electrical functionality and performance. To overcome these difficulties, sophisticated fine-tuning steps are applied to the lithographic projection apparatus and/or patterning device pattern. These include, for example, but not limited to, optimization of optical coherence settings, customized illumination schemes, use of phase shifting patterning devices, optical proximity correction (OPC) in the patterning device pattern, optimization of NA, or other methods generally defined as "resolution enhancement techniques" (RET).

In a lithographic projection apparatus, an illumination system provides illumination (i.e. radiation) to patterning device and projection optics directs the illumination from the patterning device onto a substrate. In an embodiment, the projection optics enables the formation of an aerial image (AI), which is the radiation intensity distribution on the substrate. A resist layer on the substrate is exposed and the aerial image is transferred to the resist layer as a latent "resist image" (RI) therein. The resist image (RI) can be defined as a spatial distribution of solubility of the resist in the resist layer. In an embodiment, simulation of a lithography process can simulate the production of the aerial image and/or resist image.

Figure 3:
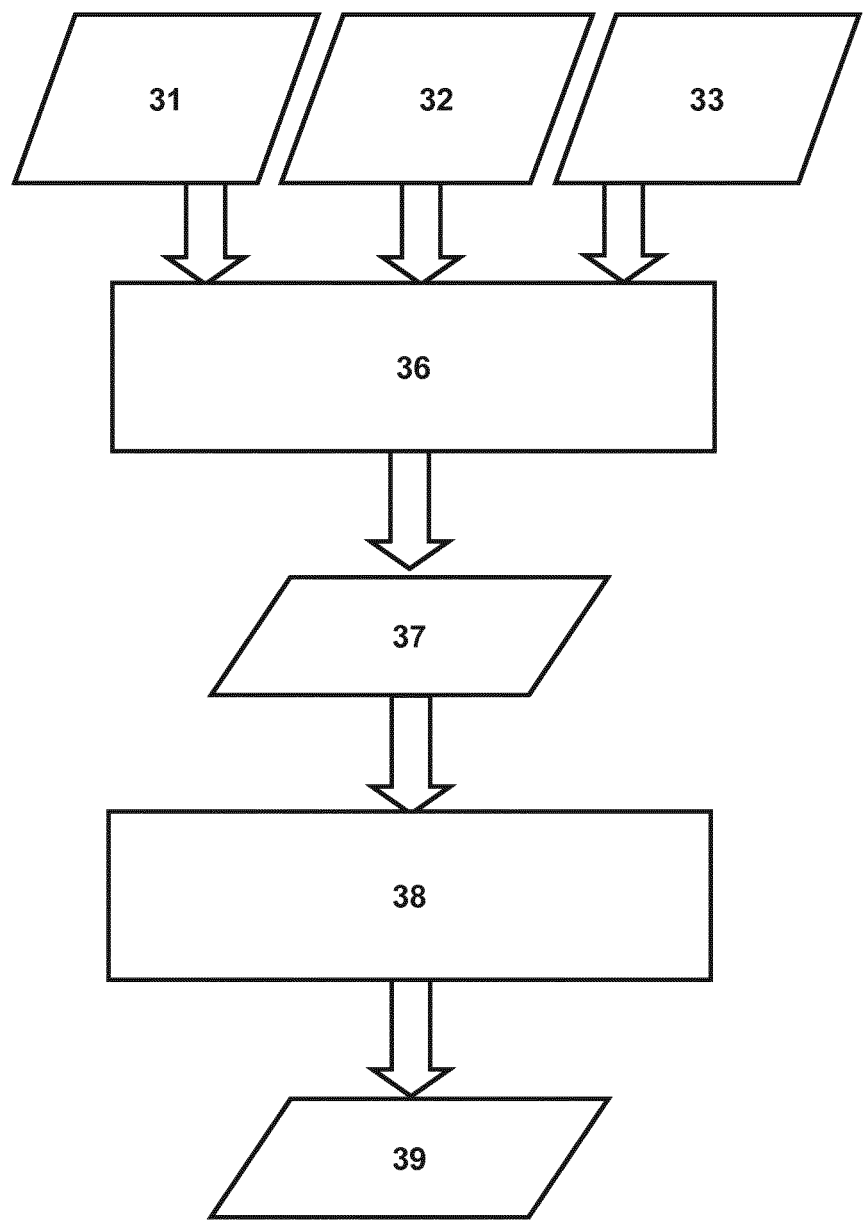
FIG. 3 is a flow chart for modelling and/or simulating parts of a patterning process, according to an embodiment.

An exemplary flow chart for modelling and/or simulating parts of a patterning process is illustrated in FIG. 3. As will be appreciated, the models may represent a different patterning process and need not comprise all the models described below.

An illumination model 31 represents optical characteristics (including radiation intensity distribution and/or phase distribution) of an illumination mode used to generate a patterned radiation beam. The illumination model 31 can represent the optical characteristics of the illumination that include, but not limited to, numerical aperture settings, illumination sigma (G) settings as well as any particular illumination mode shape (e.g. off-axis radiation shape such as annular, quadrupole, dipole, etc.), where 6 (or sigma) is outer radial extent of the illuminator.

A projection optics model 32 represents optical characteristics (including changes to the radiation intensity distribution and/or the phase distribution caused by the projection optics) of the projection optics. The projection optics model 32 may include optical aberrations caused by various factors, for example, heating of the components of the projection optics, stress caused by mechanical connections of the components of the projection optics, etc. The projection optics model 32 can represent the optical characteristics of the projection optics, including one or more selected from: an aberration, a distortion, a refractive index, a physical size, a physical dimension, an absorption, etc. Optical properties of the lithographic projection apparatus (e.g., properties of the illumination, the patterning device pattern and the projection optics) dictate the aerial image. Since the patterning device pattern used in the lithographic projection apparatus can be changed, it is desirable to separate the optical properties of the patterning device pattern from the optical properties of the rest of the lithographic projection apparatus including at least the illumination and the projection optics. The illumination model 31 and the projection optics model 32 can be combined into a transmission cross coefficient (TCC) model.

A patterning device pattern model 33 represents optical characteristics (including changes to the radiation intensity distribution and/or the phase distribution caused by a given patterning device pattern) of a patterning device pattern (e.g., a device design layout corresponding to a feature of an integrated circuit, a memory, an electronic device, etc.), which is the representation of an arrangement of features on or formed by a patterning device. The patterning device model 33 captures how the design features are laid out in the pattern of the patterning device and may include a representation of detailed physical properties of the patterning device and a patterning device pattern, as described, for example, in U.S. Pat. No. 7,587,704, which is incorporated by reference in its entirety.

A resist model 37 can be used to calculate the resist image from the aerial image. An example of such a resist model can be found in U.S. Pat. No. 8,200,468, which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 32.

Having these models, an aerial image 36 can be simulated from the illumination model 31, the projection optics model 32 and the patterning device pattern model 33. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 38 can be simulated from the aerial image 36 using a resist model 37. So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model 39. The post-pattern transfer process model 39 defines performance of one or more post-resist development processes (e.g., etch, CMP, etc.) and can produce a post-etch image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

Simulation of the patterning process can, for example, predict contours, CDs, edge placement (e.g., edge placement error), pattern shift, etc. in the aerial, resist and/or etched image. Thus, the objective of the simulation is to accurately predict, for example, edge placement, and/or contours, and/or pattern shift, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Details of techniques and models used to transform a patterning device pattern into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, 2010-0180251 and 2011-0099526, the disclosure of each which is hereby incorporated by reference in its entirety.

Figure 4:
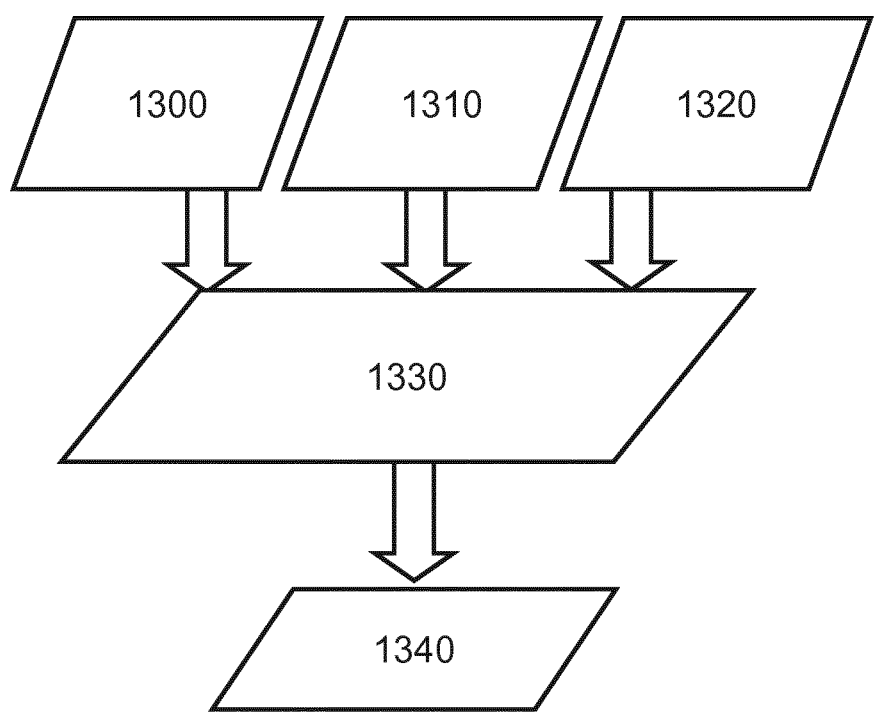
FIG. 4 is a flow chart for modelling and/or simulating a metrology process, according to an embodiment.

An exemplary flow chart for modelling and/or simulating a metrology process is illustrated in FIG. 4. As will be appreciated, the following models may represent a different metrology process and need not comprise all the models described below (e.g., some may be combined). A source model 1300 represents optical characteristics (including radiation intensity distribution, radiation wavelength, polarization, etc.) of the illumination of a metrology target. The source model 1300 can represent the optical characteristics of the illumination that include, but not limited to, wavelength, polarization, illumination sigma (σ) settings (where σ (or sigma) is a radial extent of illumination in the illuminator), any particular illumination shape (e.g. off-axis radiation shape such as annular, quadrupole, dipole, etc.), etc.

A metrology optics model 1310 represents optical characteristics (including changes to the radiation intensity distribution and/or the phase distribution caused by the metrology optics) of the metrology optics. The metrology optics 1310 can represent the optical characteristics of the illumination of the metrology target by metrology optics and the optical characteristics of the transfer of the redirected radiation from the metrology target toward the metrology apparatus detector. The metrology optics model can represent various characteristics involving the illumination of the target and the transfer of the redirected radiation from the metrology target toward the detector, including aberration, distortion, one or more refractive indexes, one or more physical sizes, one or more physical dimensions, etc.

A metrology target model 1320 can represent the optical characteristics of the illumination being redirected by the metrology target (including changes to the illumination radiation intensity distribution and/or phase distribution caused by the metrology target). Thus, the metrology target model 1320 can model the conversion of illumination radiation into redirected radiation by the metrology target. Thus, the metrology target model can simulate the resulting illumination distribution of redirected radiation from the metrology target. The metrology target model can represent various characteristics involving the illumination of the target and the creation of the redirected radiation from the metrology, including one or more refractive indexes, one or more physical sizes of the metrology, the physical layout of the metrology target, etc. Since the metrology target used can be changed, it is desirable to separate the optical properties of the metrology target from the optical properties of the rest of the metrology apparatus including at least the illumination and projection optics and the detector. The objective of the simulation is often to accurately predict, for example, intensity, phase, etc., which can then be used to derive a parameter of interest of the patterning process, such overlay, CD, focus, etc.

A pupil or aerial image 1330 can be simulated from the source model 1300, the metrology optics model 1310 and the metrology target model 1320. A pupil or aerial image is the radiation intensity distribution at the detector level. Optical properties of the metrology optics and metrology target (e.g., properties of the illumination, the metrology target and the metrology optics) dictate the pupil or aerial image.

A detector of the metrology apparatus is exposed to the pupil or aerial image and detects one or more optical properties (e.g., intensity, phase, etc.) of the pupil or aerial image. A detection model module 1320 represents how the radiation from the metrology optics is detected by the detector of the metrology apparatus. The detection model can describe how the detector detects the pupil or aerial image and can include signal to noise, sensitivity to incident radiation on the detector, etc. So, in general, the connection between the metrology optics model and the detector model is a simulated pupil or aerial image, which arises from the illumination of the metrology target by the optics, redirection of the radiation by the target and transfer of the redirected radiation to the detectors. The radiation distribution (pupil or aerial image) is turned into detection signal by absorption of incident energy on the detector.

Simulation of the metrology process can, for example, predict spatial intensity signals, spatial phase signals, etc. at the detector or other calculated values from the detection system, such as an overlay, CD, etc. value based on the detection by the detector of the pupil or aerial image. Thus, the objective of the simulation is to accurately predict, for example, detector signals or derived values such overlay, CD, corresponding to the metrology target. These values can be compared against an intended design value to, e.g., correct the patterning process, identify where a defect is predicted to occur, etc.

Thus, the model formulation describes most, if not all, of the known physics and chemistry of the overall metrology process, and each of the model parameters desirably corresponds to a distinct physical and/or chemical effect in the metrology process.

As mentioned earlier, the patterning process may involve one or more apparatuses (e.g., scanners or lithographic apparatuses) that may operate in parallel (or in cooperation with other apparatuses of the patterning process) to produce similar substrates (or wafers). Over a period of time, performance of one or more apparatus may change leading to inconsistencies (e.g., in terms of CD of same feature) between substrates produced by different apparatus or the same apparatus. In an embodiment, an actual pattern printed on a substrate can vary from scanner to scanner due to the different optical proximity effects ("OPEs") exhibited by different scanners when printing a pattern, even when the scanners are of identical model types. For example, different OPEs associated with certain scanners can introduce significant CD variations through pitch. Consequently, it is often impossible to switch between scanners and obtain identical printed patterns. Thus, engineers must optimize or tune a scanner when that scanner is new or different and is to be used to print a pattern with the expectation of obtaining resulting patterns that satisfy the design requirements. Thus, the current tuning process is an expensive, time-consuming trial and error based process that may not necessarily produce desired pattern matching.

According to the present disclosure, a performance of an apparatus may be characterized in terms of a parameter of the patterning process (e.g., CD, overlay, pitch, dose, focus, etc.). In an embodiment, a performance of an apparatus may vary due to optical characteristics (e.g., Jones pupil) of the apparatus, difference in pupil between one apparatus versus other, or difference in pupil of one apparatus over a period of time/processing steps.

Adjustment of optical characteristics, for example, via the source and/or the projection system may be desired to maintain a consistent output (e.g., substrates having desired pattern with minimum variation between different substrates) between substrates printed on different apparatuses or between substrates printed on the particular apparatus over a period of time or over multiple patterning steps.

Certain embodiments of the present disclosure comprise systems and methods for tuning an apparatus (e.g., a scanner) of the patterning process. In an embodiment, scanner tuning can be categorized into scanner matching, scanner tuning for process matching, and scanner tuning for performance optimization. Hereafter, the tunable scanner to be tuned is referred to as a target apparatus (or a target scanner), and a desired result of the tuning exercise is referred to as a reference performance. In certain embodiments, the reference performance may be measured wafer contours or CDs, simulated wafer contours or CDs, or design target polygons. Furthermore, in an embodiment, the tuning process may involve adjusting optical characteristics such as lens transmission or phase impact, matching pupil, etc. In an embodiment, pupil matching refers to a pupil configuration (e.g., list of mirrors having certain intensities and/or orientation) of the target apparatus resulting in the performance (e.g., CD of a feature) that is similar to the reference performance. In an embodiment, the adjustment to optical characteristics may be performed between two apparatuses (e.g., between a reference apparatus and a target apparatus) or the same apparatus at different points in time of the patterning process.

In an embodiment, different scanners print different CD's even when using the same reticle for exposure. One of the reasons for such differences in CD values is attributed to non-correctable factors (e.g. Jones pupil characterized by apodization, diattenuation, retardation) of the scanner. Currently there are no means to directly correct for these difference. As mentioned earlier, the current state of the art involves pattern matching by adjusting pupil knobs of the target apparatus till the printed pattern matches the desired pattern (e.g., the reference pattern). However, such adjustments do not account for a cause of the difference in the performance. Not accounting for the cause may lead to inefficient or non-optimal tuning, for example, when trying to tune for the non-correctable factors. The present disclosure determines adjustments to one or more optical parameters of the target apparatus after one or more causes are determined. In an embodiment, when a dominant contributor to the performance difference is identified as the Jones pupil, then appropriate adjustments are made to the optical parameters, for example, via knobs of the target apparatus. In an embodiment, the cause of the difference in performance may be a root cause. The root cause refers to an initiating cause (also referred as fundamental, basic or deepest cause) of a performance mismatch. In an embodiment, the root cause may be determined based on a root cause analysis of the performance mismatch including effects related to optical parameters. In an embodiment, root cause analysis involves identifying a causal chain of effects on performance of patterning process due to various process parameters including optical parameters.

Figure 5:
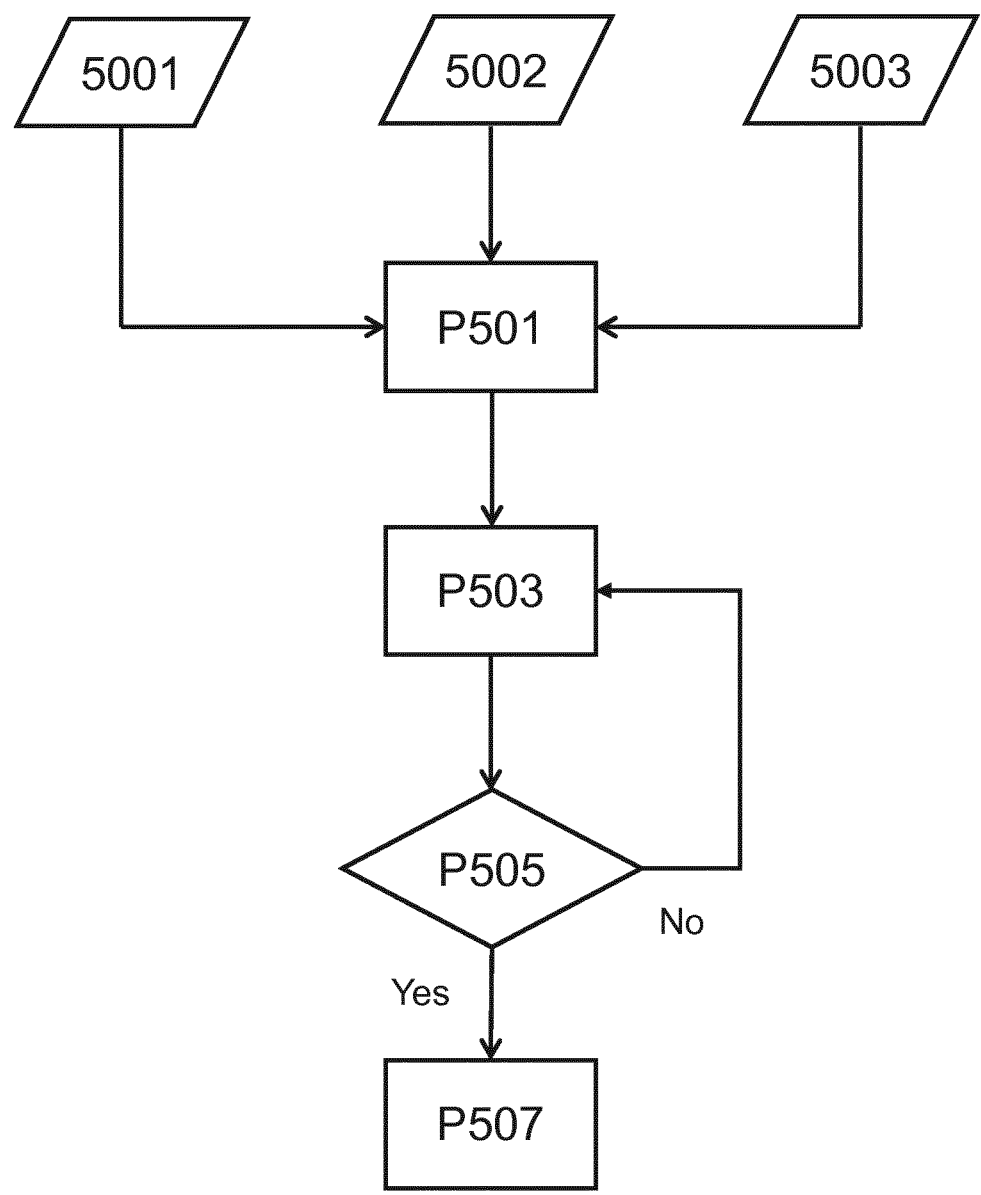
FIG. 5 is a flow chart for adjusting optical parameters of a patterning apparatus, according to an embodiment.

FIG. 5 is a flow chart for adjusting optical characteristics of a target apparatus (i.e., a patterning apparatus), according to an embodiment. The adjusting of the optical characteristics is based on determining a cause (interchangeably referred as a root cause) of a performance mismatch between a performance of the target apparatus and the reference performance. Further, based on the identified cause, the optical parameters that define the optical characteristic of the target apparatus are adjusted/modified to result in the performance that closely resembles to the reference performance.

The method involves, in process P501, obtaining a reference performance 5001, measurement data 5002, and a performance mismatch 5003, which is a difference between the reference performance 5001 and the performance of the target apparatus.

In an embodiment, the reference performance 5001 refers to a desired performance, an ideal performance, or performance related to a reference apparatus. In an embodiment, the reference performance 5001 may be obtained for a reference apparatus. The reference apparatus may be one of a plurality of the apparatuses of the patterning process against which a performance of remaining apparatuses may be compared and/or the reference apparatus may be the same apparatus whose performance may be compared to itself at different points in time (e.g., at a beginning, at a middle, or at an end) of the patterning process.

In an embodiment, the reference performance 5001 may be a performance that closely (e.g., within 0-5% of desired value) resembles an ideal and/or design intent. The performance may be expressed in terms of a value or a set of values associated with one or more parameters (e.g., CD, pitch, overlay, etc.) of the patterning process. For example, the reference performance 5001 may be a desired CD value of a feature (e.g., a CD of 10 nm for a contact hole, or a CD of 25 nm for a bar or pillar, etc.), a range of CD values associated with one or more features, or other design specification typically used define a performance of any patterning apparatus. In an embodiment, the reference performance may be determined with respect to a first apparatus (e.g., a first scanner of the patterning process), such reference performance may serve as a reference for a second apparatus (e.g., a second scanner of the patterning process also referred as the target apparatus). Such reference performance may or may not be close to ideal, but simply serves as a reference to enable matching with the performance of the second apparatus. In another embodiment, the reference performance may be determined from the second apparatus at a particular point in time, for example, at a beginning of the patterning process; such reference performance may be serve as a reference for the same apparatus at a different point in time (e.g., at a middle of the patterning process, a time when 500, 1000, 5000, 10,000, etc. wafers are produced). Also, the reference performance obtained from the second apparatus may or may not be close to ideal, but simply serves as a reference to enable matching with the performance of the second apparatus at different points in time.

In an embodiment, the reference performance (or the performance of the target apparatus) may be measured (e.g., using metrology tools) from the substrate produced by the first apparatus (or the second apparatus, e.g., at the beginning of the patterning process). In an embodiment, the reference data may be modeled and/or simulated assuming ideal conditions, for example, using metrology process of FIG. 4.

The measurement data 5002 can be any data indicative of the performance (e.g., expressed in CD) of the target apparatus. In an embodiment, the measurement data 5002 includes data from metrology tools, for example, CD-SEM measurements and contours, scatterometry data, etc. performed using metrology tools on a substrate (e.g., CD-SEM measurements) subjected to the patterning process at the target apparatus. In an embodiment, the measurement data

5002 may also include target apparatus data (either simulated or measured). For example, a dose or focus measurements of the target apparatus data, which may be further transformed into a parameter of the patterning process (e.g., CD values) via simulation of the patterning process or the metrology process.

The performance mismatch 5003 refers to a difference in a parameter of interest of the patterning process, for example, a difference between the reference performance 5001 and the measured data 5002. In an embodiment, the performance mismatch may be determined based on CD. Then, the performance mismatch for a given pattern i is:

$$\Delta CD_i = CD_{ref,i} - CD_{target,i}$$

In the equation above, $\Delta CD$ is a difference in CD values for pattern i, $CD_{ref,\,i}$ is a CD value determined or obtained from a reference apparatus (or design intent), and $CD_{target,\,i}$ is a CD value obtained from measurement data 5002.

In an embodiment, the performance mismatch may be based on other parameters of interests such as overlay, pitch, etc. In an embodiment, the performance mismatch may be a sum of the differences (e.g., $\Delta CD$) of a plurality of patterns or a weighted sum of the plurality of patterns, where a selected pattern (e.g., a critical pattern, a pattern in hot spots, etc.) may be assigned a higher weight relative to other patterns on the substrate. Then, a goal of the present tuning method may be to reduce (in an embodiment, minimize) the performance mismatch. For example, reduce $\Delta CD$ of a desired pattern or sum of $\Delta CD$ for a plurality of patterns.

The method further involves, in process P503, determining the root cause of the performance mismatch. In an embodiment, the root causes includes an optical characteristic that are associated with one or more optical parameters of the target apparatus. In an embodiment, the determination of the root cause may employ a sensitivity model to determine an effect of tuning one or more parameters of the target apparatus and/or one or more process models to simulate the patterning process (e.g., as discussed with respect to FIGS. 3 and/or 4) based on the measurement data 5002. For example, one or more process models (e.g., source model, optics model, patterning device model, etc.) may be used in conjunction with the sensitivity model to determine the effect of a change in the values of optical parameter. The present disclosure is not limited to the root cause determined using a sensitivity model. In an embodiment, any other root cause analysis approaches may be employed to determine a root cause of the performance mismatch. For example, process simulations may be performed to determine whether a defect in resist (e.g., a footing) is caused by an optical interference effect, or by a chemical interaction with the bottom antireflection coating (BARC), for example. Such simulation may require, for example, measurements of BARC optical parameters (e.g., thickness, n, and k)

In an embodiment, the sensitivity model includes the optical parameters that allow determination of an effect of tuning the optical parameters of the target apparatus on the pattern printed on the substrate. Such effect of tuning may be further correlated with the performance mismatch. Thus, a root cause of the performance mismatch due to an optical characteristic may be determined. Examples of the sensitivity model and/or generation of the sensitivity model are discussed below.

In an embodiment, symbolically, the goal of sensitivity modeling is to predict the CD change $\Delta CD_i$, for pattern i in response to change in the optical parameters via, for example, knob changes $\Delta k_j$. In an embodiment, a linear model can work reasonably well because the tuning amount is small, however the present disclosure is not limited to linear models. Thus, where the linear model is applicable, $$\Delta CD_i = \sum_j \frac{\partial CD_i}{\partial k_j} \Delta k_j,$$

the purpose of the sensitivity model is to calculate the partial derivatives $$\frac{\partial CD_i}{\partial k_j},$$

given, for example, a mask pattern i. By the chain rule of derivatives:

$$\frac{\partial CD_i}{\partial k_j} = \sum_m \frac{\partial CD_i}{\partial p_m} \frac{\partial p_m}{\partial k_j},$$

where $p_m$ refers to a physical parameter in the scanner model. It is therefore apparent that the first factor $$\frac{\partial CD_i}{\partial p_m}$$

concerns the patterning process model, while the second factor $$\frac{\partial p_m}{\partial k_j}$$

concerns the scanner model.

In the more general, non-linear case, the physics and models can be represented as:

$$CD_i(k_j) = f(k_j) = f^{litho}(p_m) = f^{litho}(f^{scanner}(k_j))$$

The resist, optical, and scanner physics can be represented as separate modeling components. The accuracy of the sensitivity model depends on the accuracy of both the litho model (e.g. comprising an optical and a resist model) and the scanner model.

The concept of sensitivity model accuracy is closely related to that of model separability, both having to do with imaging predictions for different scanner settings. See, e.g., U.S. patent application Ser. No. 11/461,929 and Ser. No. 11/530,402. For OPC-type applications, separable models are desirable for prediction accuracy over process window (typically focus and exposure), and for reduction in model calibration turn-around time when exposure settings are changed. The litho model typically comprises an optical model, a resist model and, sometimes, an etch model, and separability is emphasized between the different model steps.

In an embodiment, the method, in process P507, involves performing sensitivity analysis based on the sensitivity model employing the reference performance and the measurement data. Further, the sensitivity model may be used to identify dominant optical parameters that cause the performance mismatch. For example, execution of the sensitivity model using measurement data may indicate that the root cause of the performance mismatch (e.g., ΔCD) may be parameters related to a resist process or patterning device pattern. In which case, no adjustment to the optical parameters may be performed according to the present disclosure. However, if the root cause of the performance mismatch is due to an optical characteristic such as lens transmission or phase, then appropriate adjustments to the optical parameters via, for example, knob changes $\Delta k_j$ may be determined such that the performance mismatch is reduced, in an embodiment, minimized.

In an embodiment, the optical parameters of the target apparatus may comprise any suitable combination selected from one or more characteristics of the illumination mode (e.g., pupil fill ratio, namely percentage of radiation of the illumination that passes through a pupil or aperture). One or more of the optical parameters may be simultaneously adjusted so that the mismatch (e.g., a performance mismatch) between the target apparatus and the reference apparatus is reduced, in an embodiment minimized.

In process P505 a determination is made whether the root cause is Jones pupil or other non-tunable optical parameter. If the root cause is different from an optical characteristic (e.g., Jones pupil) according to an embodiment of the present disclosure, then tuning of the target apparatus is not performed.

If the root cause is determined to be an optical characteristic (e.g., Jones pupil), the method involves, in process P507, adjusting optical parameters associated with an adjustable optical parameters of the target apparatus to reduce the performance mismatch due to the optical characteristic. This process P507 may also be referred as a tuning step P507 or tuning process P507.

The tuning step P507 is an iterative process, where an iteration includes determining values of the dominant optical parameters such that the performance mismatch is reduced. According to the determined values of the optical parameters, adjusting optical parameters of the target apparatus.

In an embodiment, the optical characteristic is Jones pupil represented by an apodization map, a phase map, a retardation map, and/or a diattenuation map. Using these maps, the sensitivity model may isolate the root cause as one or a combination of a lens apodization, a lens retardation, or a lens diattenuation. In an example, when the root cause is the lens apodization or the lens diattenuation, the adjusting of the optical parameters include adjusting an illumination pupil of the apparatus. In another example, when the root cause is lens retardation, the adjusting of the optical parameters include adjusting lens aberrations of the apparatus.

Thus, based on the adjustment to the illumination pupil or the lens aberrations a determination is made whether the performance mismatch is reduced (in an embodiment, minimized). In an embodiment, when the performance mismatch is minimized, the tuning process P507 stops. At the end of the process P507, the method results in values of the optical parameters of the target apparatus that reduces the variation in the performance of the target apparatus with respect to the reference performance. Effectively, the patterning process produces printed substrates having less variations in printed patterns.

In an embodiment, upon tuning the target apparatus, the method may further include printing a pattern on the substrate using the tuned apparatus, where the tuned apparatus has values of the optical parameters determined as discussed above. Further, measurement data of the printed pattern may be obtained and the performance of the target apparatus may be verified against the reference performance based on the measurement data.

The method, according to the present disclosure, has several advantages. For example, natural variation of non-adjustable parameters can cause large performance variation with respect to a desired specification. Such variation may be reduced by adjusting the optical parameters according to the present disclosure. When the cause of performance mismatch is a non-tunable optical characteristic, a replacement of hardware related to the non-tunable cause may be required. However, according to the present disclosure, if a non-tunable parameter is flagged, tuning a single or multiple scanner knobs to compensate for the non-tunable charateristic can be proposed. Accordingly, in an embodiment, a non-tuneable parameter (e.g. lens apodization) can be corrected for by a tuning a tunable parameter of the target scanner.

Figure 6:
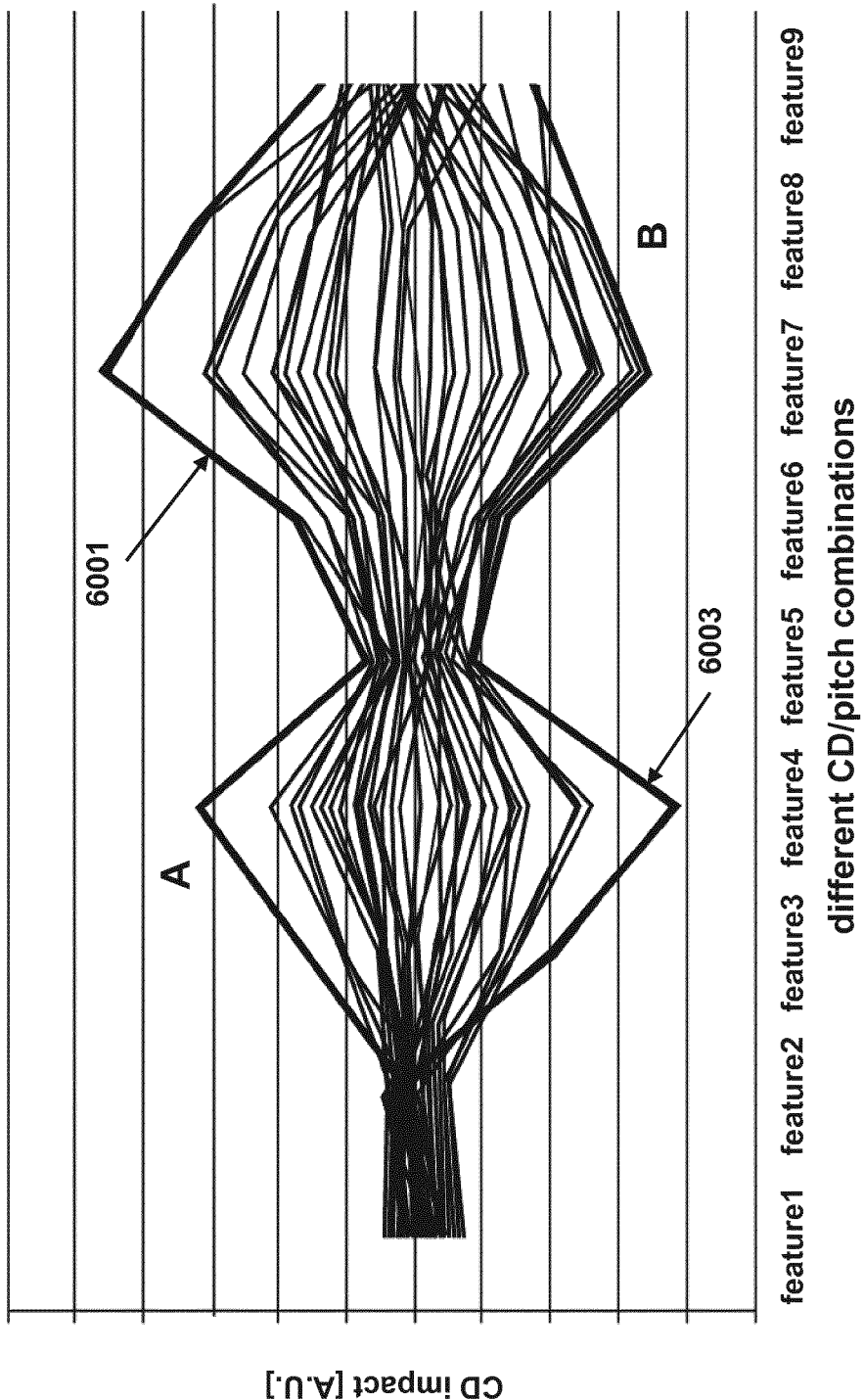
FIG. 6 illustrates example impact of an optical characteristic on a parameter of the patterning process, according to an embodiment.

FIG. 6 illustrates example impact of an optical characteristic on a parameter of the patterning process. In an embodiment, the optical characteristic is Jones pupil that leads to proximity effect resulting in a large variation (Y-axis) in a CD (or pitch values) of the features. For example, in FIG. 6, proximity impact 6001 (e.g., ΔCD) may be attributed to the apodization of a lens A of the target apparatus. Another proximity impact 6003 (e.g., ΔCD) may be the apodization of a lens B of the target apparatus. Such lens A and B thereby cause performance mismatch between the target apparatus and the reference apparatus, for example. In other words, for the lens A and lens B, the apodization may be considered as the root cause of the performance mismatch and the optical parameters corresponding to the apodization of the lens A and B may be adjusted, as per the method of FIG. 5 discussed above. For example, the apodization of lens A may be adjusted by adjusting the knobs (i.e., optical parameters) of the illumination pupil, which controls the intensity variation over the pupil.

Figure 7:
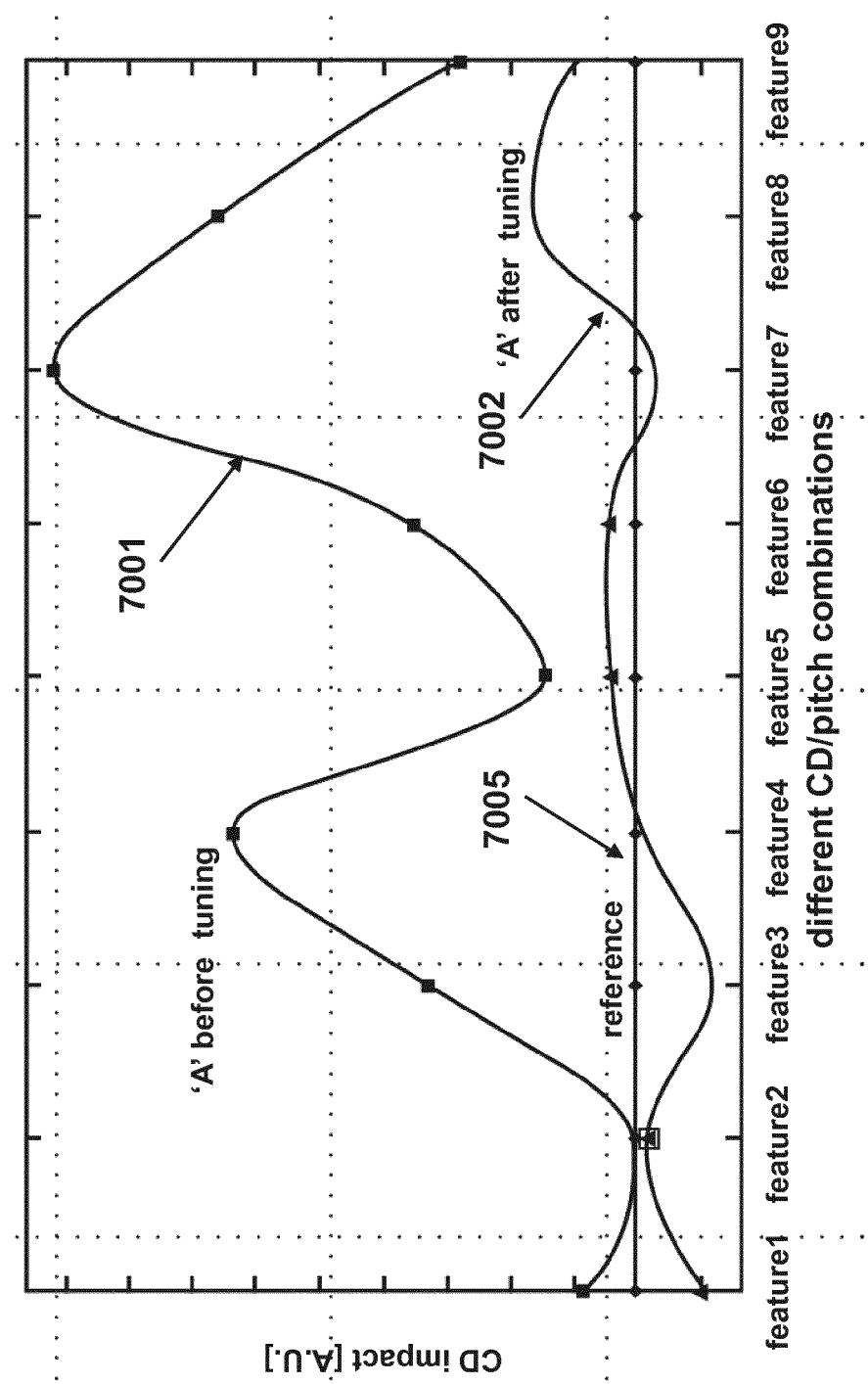
FIG. 7 illustrates variation in critical dimension (CD) of a feature printed by an un-tuned patterning apparatus and a tuned patterning apparatus, according to an embodiment.

FIG. 7 illustrates variation in a parameter (e.g., CD) of a feature printed by an un-tuned patterning apparatus and a tuned patterning apparatus. In an embodiment, such variation may be caused by Jones pupil of the lens A. In FIG. 7, a curve 7001 corresponds to, for example, the lens A. The curve 7001 represents CD variation or a difference in CD values for different feature sizes with respect to the reference 7005 (i.e., ΔCD=0). The curve 7001 indicates that an un-tuned pattern apparatus, particularly lens A, causes a large variation in CD, which is highly undesirable and affects a yield of the patterning process. Upon tuning the patterning apparatus, as mentioned above in FIG. 6, the CD variation is substantially reduced. A curve 7002 illustrates a CD variation of the tuned apparatus that indicates the CD variation is fairly close to the reference 7005. Thus, a better yield can be expected from the tuned apparatus.

Figure 8A:
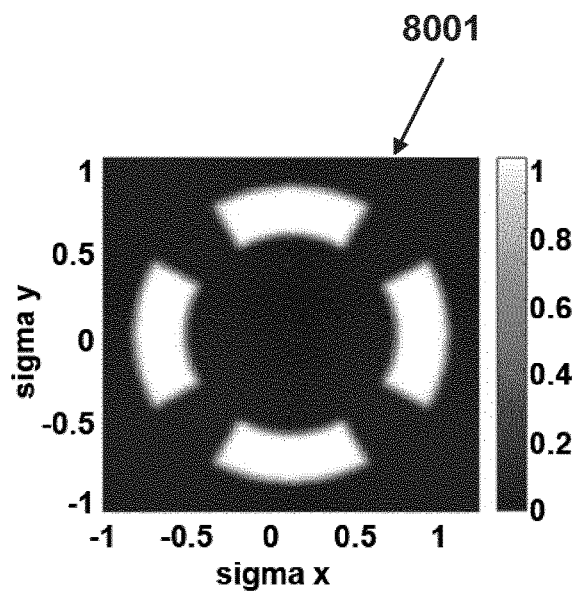
FIG. 8A illustrates an example pupil of the un-tuned patterning apparatus, according to an embodiment.

FIG. 8A illustrates an example pupil of an un-tuned apparatus, according to an embodiment. In FIG. 8A, the un-tuned apparatus has an un-tuned pupil 8001. The un-tuned pupil may be a quadrupole having high intensities (e.g., close to 1 unit) within the four arcuate portions, while outside the quadrupole the intensities may be approximately zero.

Figure 8B:
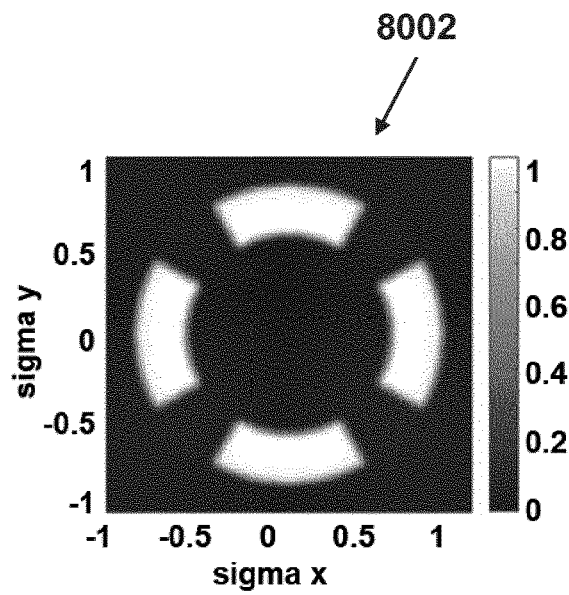
FIG. 8B illustrates an example pupil of the tuned patterning apparatus, according to an embodiment.

Similarly, FIG. 8B illustrates an example pupil of a tuned apparatus. For example, the tuned apparatus has a tuned pupil 8002, where the tuning is performed according to method of FIG. 5. In FIGS. 8A and 8B, the un-tuned pupil 8001 and the tuned pupil 8002, respectively, appear to be similar. However, there is a difference between the pupils 8001 and 8002, as illustrated in FIG. 8C.

Figure 8C:
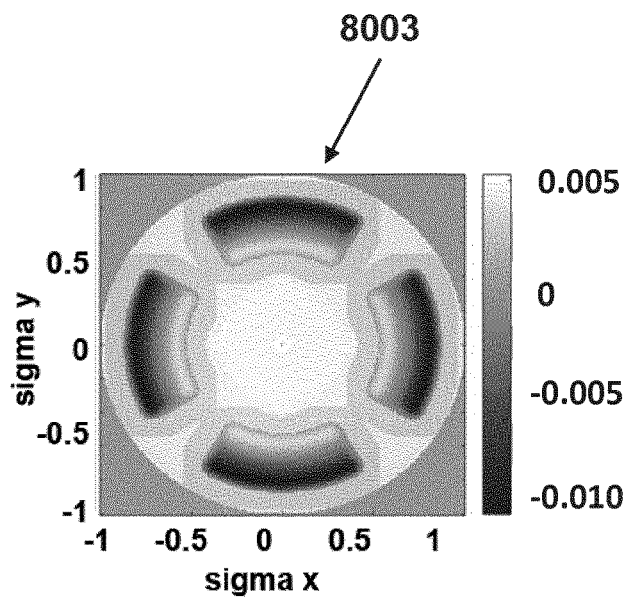
FIG. 8C illustrates a difference in pupil of the un-tuned patterning apparatus of FIG. 8A and the tuned patterning apparatus of FIG. 8B, according to an embodiment.

FIG. 8C clearly illustrates that the intensities of the tuned pupil 8002 are different from the intensities of the pupil 8001. Although the difference may appear to be small, the tuned-pupil can substantially reduce CD variation, for example, as illustrated by curve 7002 in FIG. 7, and bring the performance of the target apparatus close to the reference performance 7005 in FIG. 7.

Figure 9:
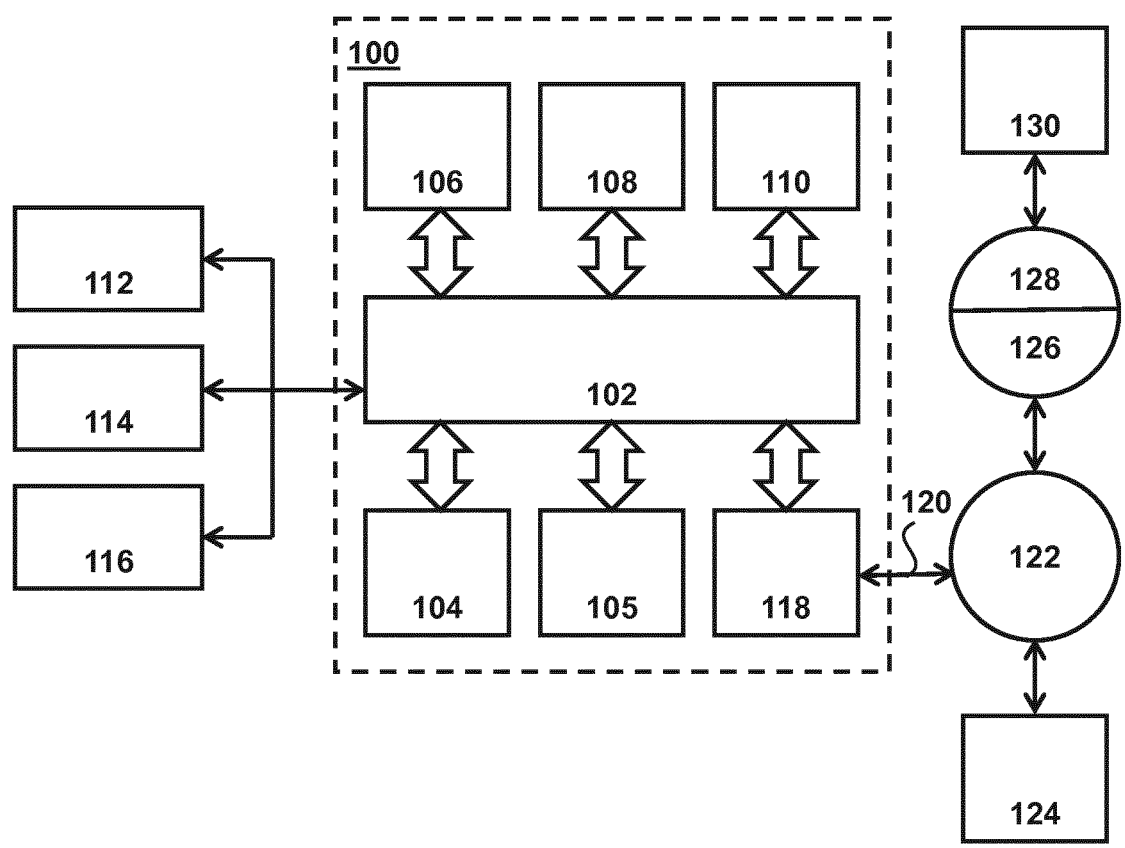
FIG. 9 is a block diagram of an example computer system in which embodiments can be implemented, according to an embodiment.

FIG. 9 is a block diagram that illustrates a computer system 100 which can assist in implementing the optimization methods and flows disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions. Thus, embodiments are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with one or more embodiments, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 10:
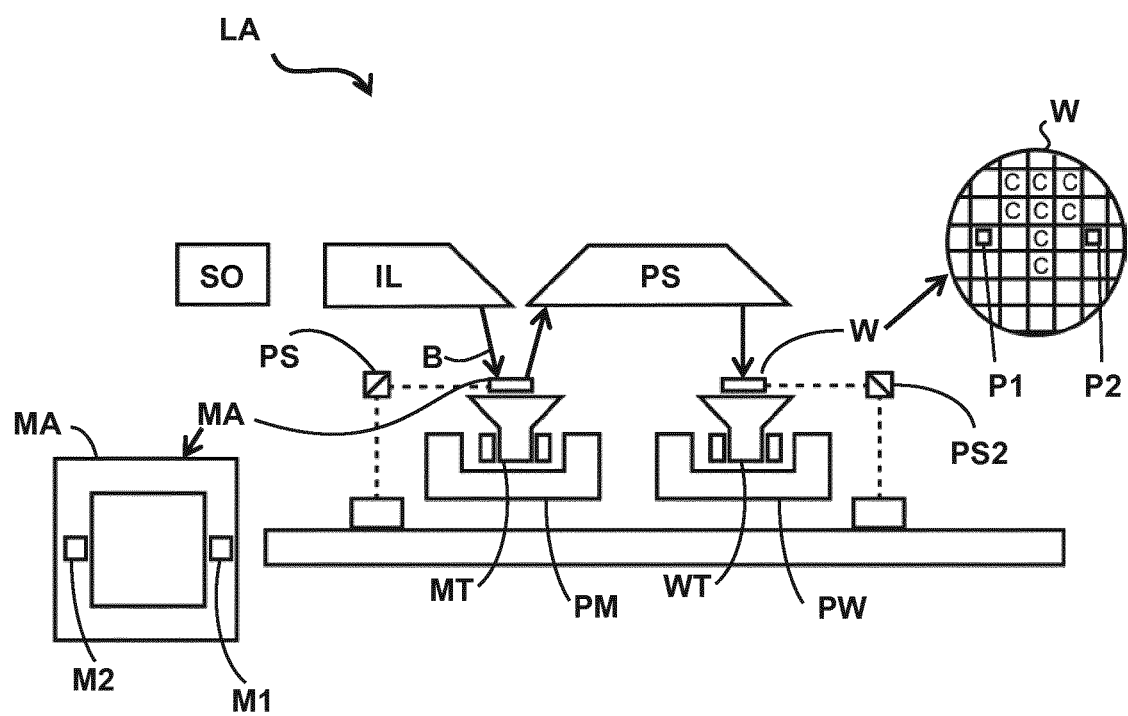
FIG. 10 is a schematic diagram of another lithographic projection apparatus, according to an embodiment.

FIG. 10 schematically depicts another exemplary lithographic projection apparatus LA that includes:

a source collector module SO to provide radiation.

an illumination system (illuminator) IL configured to condition a radiation beam B (e.g. EUV radiation) from the source collector module SO.

a support structure (e.g. a mask table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have multi-layer reflectors comprising, for example, a multi-layer stack of molybdenum and silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 10, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 10, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the radiation source may be an integral part of the source collector module, for example when the radiation source is a discharge produced plasma EUV generator, often termed as a DPP radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 11:
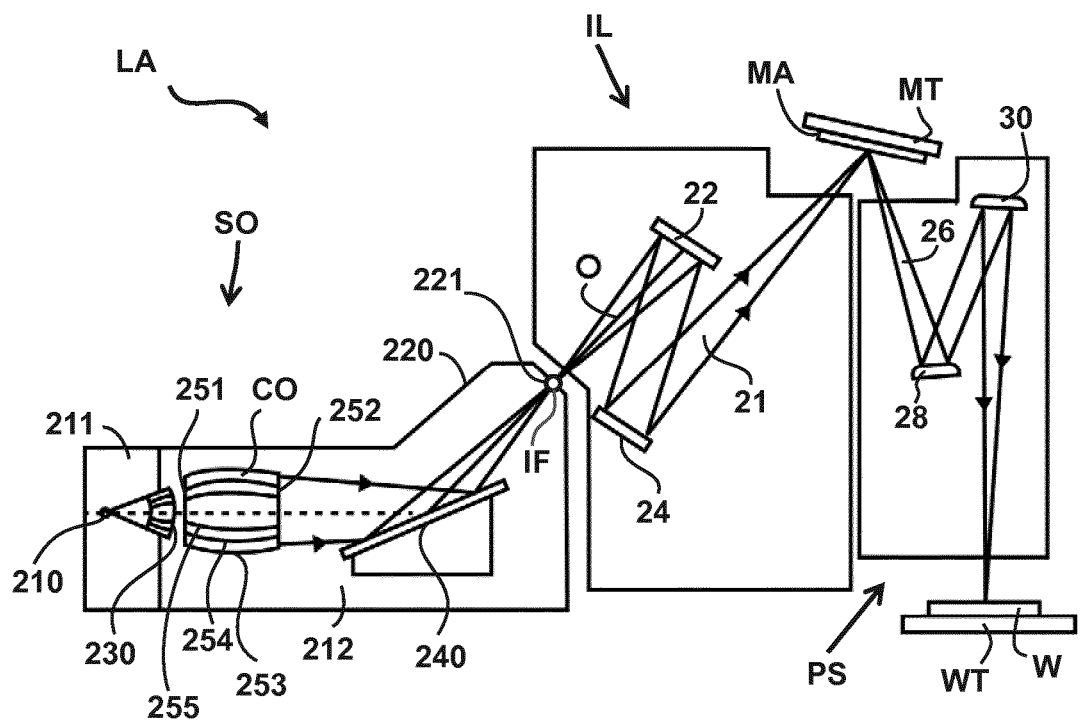
FIG. 11 is a more detailed view of the apparatus in FIG. 10, according to an embodiment.
Figure 12:
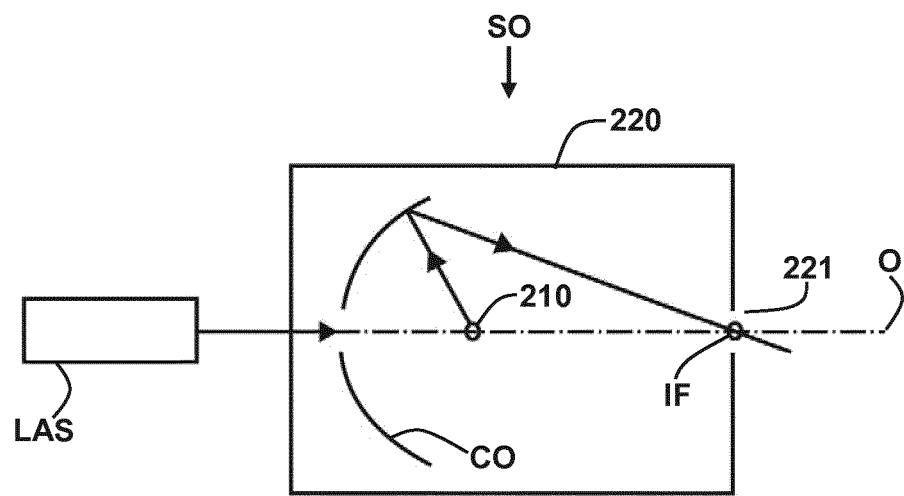
FIG. 12 is a more detailed view of the source collector module of the apparatus of FIG. 10 and FIG. 11, according to an embodiment.

FIG. 11 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma radiation source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more minors present than those shown in the FIGS., for example there may be 1-6 additional reflective elements present in the projection system PS than shown in FIG. 11.

Collector optic CO, as illustrated in FIG. 11, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma radiation source.

Alternatively, the source collector module SO may be part of an LPP radiation system as shown in FIG. 16. A laser LAS is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:
1. A method for tuning a target apparatus of a patterning process comprising:
    obtaining (i) a reference performance, and (ii) measurement data of a substrate subjected to the patterning process at the target apparatus, the measurement data indicative of a performance of the target apparatus;
    determining, via a processor, a cause of a performance mismatch based on a difference between the reference performance and the performance of the target apparatus, wherein the cause includes an optical characteristic; and
    responsive to the cause, adjusting, via the processor, optical parameters associated with an adjustable optical characteristic to reduce the performance mismatch in the optical characteristic.
2. The method of clause 1, wherein the determining the cause comprises:
    obtaining a sensitivity model including the optical parameters associated with the adjustable optical characteristic;
    performing a sensitivity analysis based on the sensitivity model employing the reference performance and the measurement data; and identifying dominant optical parameters that cause the performance mismatch.
3. The method of any of clauses 1 to 2, wherein the adjusting the optical parameters is an iterative process, an iteration comprises:
    determining values of the dominant optical parameters such that the performance mismatch is reduced;
    adjusting optical parameters of the target apparatus according to the determined values of the optical parameters; and
    determining whether the performance mismatch is reduced.
4. The method of any of clauses 1 to 3, wherein the optical characteristic is a non-tunable characteristic represented by a apodization map, a phase map, a retardatiaon map, and/or a diattenuation map.
5. The method of clause 4, wherein the adjusting of the optical parameters include adjusting an illumination pupil of the target apparatus when the cause is lens apodization or lens diattenuation.
6. The method of clause 4, wherein the adjusting of the optical parameters include adjusting lens aberrations of the target apparatus when the cause is lens retardation.
7. The method of any of clauses 1 to 6, wherein the performance mismatch is minimized.
8. The method of any of clauses 1 to 7, further comprising:
    printing a pattern on the substrate using the target apparatus tuned according to the values of the optical parameters; and
    obtaining measurement data of the printed pattern; and
    verifying the performance of the target apparatus against the reference performance based on the measurement data.
9. The method of any of clauses 1 to 8, wherein the reference performance is a performance of a reference apparatus different from the target apparatus.
10. The method of any of clauses 1 to 8, wherein the reference performance is a performance of the target apparatus determined at a particular time of the patterning process.
11. The method of any of clauses 1 to 10, wherein the performance and the reference performance are related to a parameter of the patterning process including critical dimension and/or overlay.
12. A method for tuning a target apparatus of a patterning process comprising:
    obtaining (i) a reference performance, (ii) measurement data of a substrate subjected to the patterning process at the target apparatus, the measurement data indicative of a performance of the target apparatus, and (iii) a sensitivity model configured to translate an optical characteristic to the performance of the patterning process;

determining, via a processor, a performance mismatch based on difference between the reference performance and the measurement data; simulating, via the processor, the sensitivity model to determine a cause of the performance mismatch; and responsive to the cause, adjusting, via the processor, optical parameters corresponding to the optical characteristic of the target apparatus to reduce the performance mismatch.

13. The method of clause 12, wherein the optical characteristic is a non-tunable characteristic represented by an apodization map, a phase map, a retardatiaon map, and/or a diattenuation map.

14. The method of clause 13, wherein the adjusting of the optical parameters include adjusting an illumination pupil of the target apparatus when the cause is lens apodization or lens diattenuation.

15. The method of clause 13, wherein the adjusting of the optical parameters include adjusting lens aberrations of the target apparatus when the cause is lens retardation.

16. A computer program product comprising a non-transitory computer readable medium having instructions recorded thereon, the instructions when executed by a computer implementing the method of any of clauses 1 to 15.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although specific reference may be made in this text to the use of embodiments in the manufacture of ICs, it should be understood that the embodiments herein may have many other possible applications. For example, it may be employed in the manufacture of integrated optical systems, guidance and detection patterns for magnetic domain memories, liquid-crystal displays (LCDs), thin film magnetic heads, micromechanical systems (MEMs), etc. The skilled artisan will appreciate that, in the context of such alternative applications, any use of the terms "reticle", "wafer" or "die" herein may be considered as synonymous or interchangeable with the more general terms "patterning device", "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create, for example, a multi-layer IC, so that the term substrate used herein may also refer to a substrate that already contains multiple processed layers.

In the present document, the terms "radiation" and "beam" as used herein encompass all types of electromagnetic radiation, including ultraviolet radiation (e.g. with a wavelength of about 365, about 248, about 193, about 157 or about 126 nm) and extreme ultra-violet (EUV) radiation (e.g. having a wavelength in the range of 5-20 nm), as well as particle beams, such as ion beams or electron beams.

The terms "optimizing" and "optimization" as used herein refers to or means adjusting a patterning apparatus (e.g., a lithography apparatus), a patterning process, etc. such that results and/or processes have more desirable characteristics, such as higher accuracy of projection of a design pattern on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

Aspects of the invention can be implemented in any convenient form. For example, an embodiment may be implemented by one or more appropriate computer programs which may be carried on an appropriate carrier medium which may be a tangible carrier medium (e.g. a disk) or an intangible carrier medium (e.g. a communications signal). Embodiments of the invention may be implemented using suitable apparatus which may specifically take the form of a programmable computer running a computer program arranged to implement a method as described herein. Thus, embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every. References to selection from a range includes the end points of the range.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. A method for tuning a target apparatus of a patterning process, the method comprising:
   obtaining (i) a reference performance, and (ii) measurement data of a substrate subjected to the patterning process at the target apparatus, the measurement data indicative of a performance of the target apparatus;
   determining, by a hardware processor system and based on a difference between the reference performance and the performance of the target apparatus, an optical cause of a performance mismatch as distinguished from a non-optical cause of performance mismatch, wherein the cause includes an optical characteristic; and
   responsive to the cause, adjusting an optical parameter associated with an adjustable optical characteristic to reduce the performance mismatch in the optical characteristic.

2. The method of claim 1, wherein the determining the cause comprises:
   obtaining a sensitivity model including the optical parameter associated with the adjustable optical characteristic;
   performing a sensitivity analysis based on the sensitivity model employing the reference performance and the measurement data; and
   identifying a dominant optical parameter that causes the performance mismatch.

3. The method of claim 1, wherein the adjusting the optical parameter is an iterative process, an iteration comprises:
   determining a value of a dominant optical parameter such that the performance mismatch is reduced;
   adjusting an optical parameter of the target apparatus according to the determined value of the dominant optical parameter; and
   determining whether the performance mismatch is reduced.

4. The method of claim 1, wherein the optical characteristic is a non-tunable characteristic represented by an apodization map, a phase map, a retardation map, and/or a diattenuation map.

5. The method of claim 1, wherein the adjusting of the optical parameter includes adjusting an illumination pupil of the target apparatus.

6. The method of claim 1, wherein the adjusting of the optical parameter includes adjusting a lens aberration of the target apparatus.

7. The method of claim 1, wherein the performance mismatch is minimized.

8. The method of claim 1, further comprising:
   printing a pattern on the substrate using the target apparatus tuned according to the optical parameter; and
   obtaining measurement data of the printed pattern; and
   verifying the performance of the target apparatus against the reference performance based on the measurement data.

9. The method of claim 1, wherein the reference performance is a performance of a reference apparatus different from the target apparatus.

10. The method of claim 1, wherein the reference performance is a performance of the target apparatus determined at a particular time of the patterning process.

11. The method of claim 1, wherein the performance of the target apparatus and the reference performance are related to a parameter of the patterning process including critical dimension and/or overlay.

12. A computer program product comprising a non-transitory computer readable medium having instructions therein, the instructions, when executed by a computer system, configured to cause the computer system to at least:
   obtain (i) a reference performance, and (ii) measurement data of a substrate subjected to the patterning process at the target apparatus, the measurement data indicative of a performance of the target apparatus;
   determine, based on a difference between the reference performance and the performance of the target apparatus, an optical cause of a performance mismatch as distinguished from a non-optical cause of performance mismatch, wherein the cause includes an optical characteristic; and
   responsive to the cause, adjust an optical parameter associated with an adjustable optical characteristic to reduce the performance mismatch in the optical characteristic.

13. The computer program product of claim 12, wherein the instructions configured to cause the computer system to determine the cause are further configured to cause the computer system to:
   obtaining a sensitivity model including the optical parameter associated with the adjustable optical characteristic;
   perform a sensitivity analysis based on the sensitivity model employing the reference performance and the measurement data; and
   identify a dominant optical parameter that causes the performance mismatch.

14. The computer program product of claim 12, wherein the optical characteristic is a non-tunable characteristic represented by an apodization map, a phase map, a retardation map, and/or a diattenuation map.

15. The computer program product of claim 12, wherein adjustment of the optical parameter includes adjustment of an illumination pupil of the target apparatus or adjustment of a lens aberration of the target apparatus.

16. The computer program product of claim 12, wherein the reference performance is a performance of a reference apparatus different from the target apparatus.

17. The computer program product of claim 12, wherein the performance of the target apparatus and the reference performance are related to a parameter of the patterning process including critical dimension and/or overlay.

18. A computer program product comprising a non-transitory computer readable medium having instructions therein, the instructions, when executed by a computer system, configured to cause the computer system to at least:
   obtain (i) a reference performance, (ii) measurement data of a substrate subjected to a patterning process at a target apparatus, the measurement data indicative of a performance of the target apparatus, and (iii) a sensitivity model configured to translate an optical characteristic to the performance of the patterning process;
   determine a performance mismatch based on a difference between the reference performance and the measurement data;
   perform a simulation using the sensitivity model to determine a cause of the performance mismatch as distinguished from another cause of performance mismatch; and
   responsive to the cause, adjust an optical parameter corresponding to the optical characteristic of the target apparatus to reduce the performance mismatch.

19. The computer program product of claim 18, wherein the optical characteristic is a non-tunable characteristic represented by an apodization map, a phase map, a retardation map, and/or a diattenuation map.

20. The computer program product of claim 18, wherein adjustment of the optical parameter includes adjustment of an illumination pupil of the target apparatus or adjustment of a lens aberration of the target apparatus.

* * * * *